(12) United States Patent
Luruthudass et al.

(10) Patent No.: US 9,190,553 B2
(45) Date of Patent: Nov. 17, 2015

(54) OPTOELECTRONIC SEMICONDUCTOR COMPONENT, METHOD FOR PRODUCING SAME AND USE OF SUCH A COMPONENT

(75) Inventors: Annaniah Luruthudass, Penang (MY); Ratha Krishnan Vicknes, Penang (MY)

(73) Assignee: OSRAM Opto Semiconductors GmbH (DE)

( * ) Notice: Subject to any disclaimer, the term of this patent is extended or adjusted under 35 U.S.C. 154(b) by 235 days.

(21) Appl. No.: 13/991,496

(22) PCT Filed: Nov. 2, 2011

(86) PCT No.: PCT/EP2011/069249
§ 371 (c)(1),
(2), (4) Date: Aug. 22, 2013

(87) PCT Pub. No.: WO2012/076258
PCT Pub. Date: Jun. 14, 2012

(65) Prior Publication Data
US 2013/0334544 A1    Dec. 19, 2013

(30) Foreign Application Priority Data

Dec. 8, 2010   (DE) .......................... 10 2010 053 809

(51) Int. Cl.
*H01L 31/12*   (2006.01)
*H01L 31/147*  (2006.01)
*H01L 25/16*   (2006.01)

(52) U.S. Cl.
CPC .............. *H01L 31/12* (2013.01); *H01L 31/147* (2013.01); *H01L 25/167* (2013.01); *H01L 2224/48137* (2013.01)

(58) Field of Classification Search
CPC ........... H01L 2224/32245; H01L 2224/48091; H01L 2224/48247; H01L 2224/73265; H01L 2924/00; H01L 2924/00014; H01L 2224/48137; H01L 2224/8592; H01L 25/167; H01L 31/12; H01L 31/147; H01L 33/54; H01L 2924/0002; H01L 2224/32145; H01L 2924/10253; H01L 2924/15747; H01L 2924/3025

See application file for complete search history.

(56) References Cited

U.S. PATENT DOCUMENTS 4,309,605 A    1/1982   Okabe
5,340,993 A    8/1994   Salina et al.

(Continued)

FOREIGN PATENT DOCUMENTS

CN   201615434    10/2010
DE   26 56 185    6/1978

(Continued)

OTHER PUBLICATIONS

The Taiwanese Search Report issued on Oct. 28, 2013 in corresponding Taiwanese Patent Application No. 100144826.

(Continued)

*Primary Examiner* — Robert Bachner
(74) *Attorney, Agent, or Firm* — DLA Piper LLP (US)

(57) ABSTRACT

An opto-electronic component includes a housing, a radiation-emitting semiconductor chip and a radiation-detecting semiconductor chip. A first cavity and a second cavity are formed in the housing, wherein the radiation-emitting semiconductor chip is arranged in the first cavity and is cast by means of a first casting compound. The radiation-detecting semiconductor chip is arranged in the second cavity and cast by means of a second casting compound, wherein absorber particles are embedded in the second casting compound which are suitable for at least partially absorbing the radiation emitted by the radiation-emitting semiconductor chip.

12 Claims, 3 Drawing Sheets

(56) References Cited

U.S. PATENT DOCUMENTS

| | | | |
|---|---|---|---|
| 2003/0218174 A1* | 11/2003 | Verdonk et al. | 257/80 |
| 2006/0016970 A1 | 1/2006 | Nagasaka et al. | |
| 2006/0071150 A1* | 4/2006 | Aizpuru | 250/214.1 |
| 2008/0123328 A1 | 5/2008 | Lai et al. | |
| 2009/0065800 A1* | 3/2009 | Wirth et al. | 257/100 |
| 2009/0095971 A1* | 4/2009 | Glovatsky et al. | 257/99 |
| 2010/0026192 A1 | 2/2010 | Hadwen et al. | |
| 2010/0148330 A1* | 6/2010 | Ehrenpfordt | 257/676 |

FOREIGN PATENT DOCUMENTS

| | | |
|---|---|---|
| DE | 90 02 812.0 | 7/1990 |
| DE | 90 03 012.5 | 7/1990 |
| DE | 42 42 842 A1 | 8/1993 |
| DE | 196 00 678 A1 | 7/1997 |
| DE | 102 14 121 C1 | 12/2003 |
| DE | 10 2005 061 798 A1 | 4/2007 |
| DE | 10 2006 016 523 A1 | 10/2007 |
| DE | 10 2007 001 706 A1 | 7/2008 |
| DE | 10 2008 025 159 A1 | 12/2009 |
| EP | 0 493 051 B1 | 7/1995 |
| EP | 1 079 443 A1 | 2/2001 |
| EP | 1 187 227 A2 | 3/2002 |
| EP | 1 858 086 A1 | 11/2007 |
| JP | 58-093388 | 6/1983 |
| JP | 08-130325 | 5/1996 |
| JP | 2007-266049 | 10/2007 |
| TW | 200729557 | 8/2007 |
| TW | 200824138 | 6/2008 |
| WO | 2008/083672 | 7/2008 |
| WO | 2010/085286 | 7/2010 |

OTHER PUBLICATIONS

English translation of Japanese Notice of Reasons for Rejection dispatched May 13, 2014 from corresponding Japanese Patent Application No. 2013-541270.

* cited by examiner

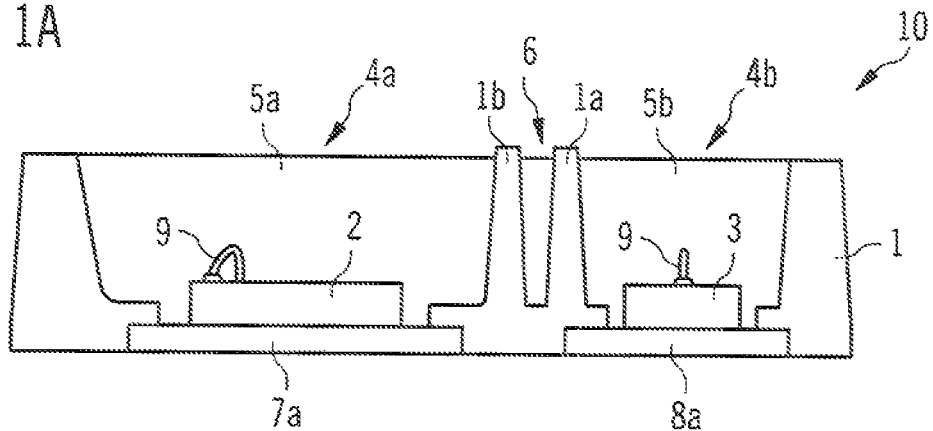
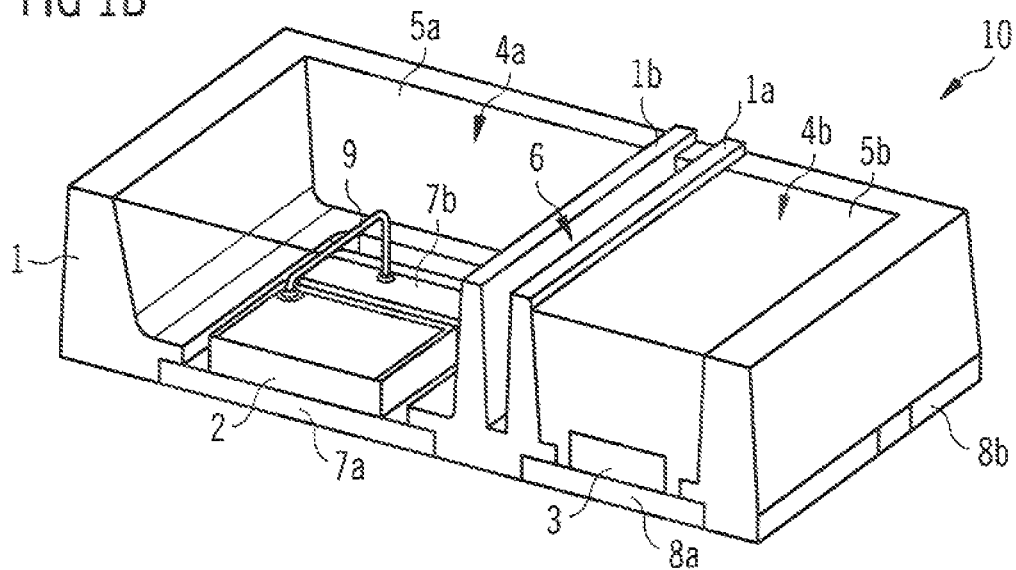
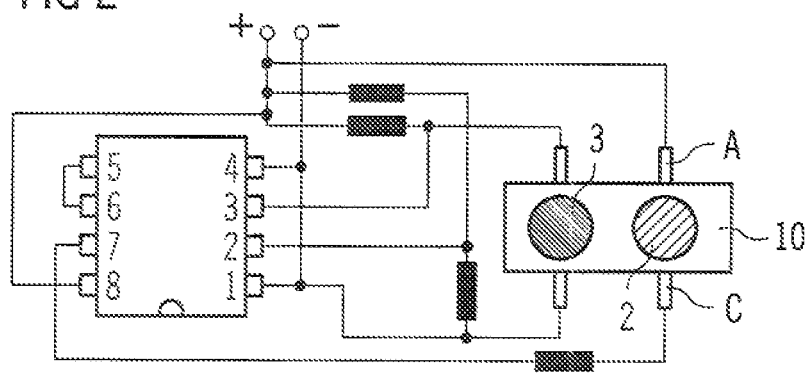

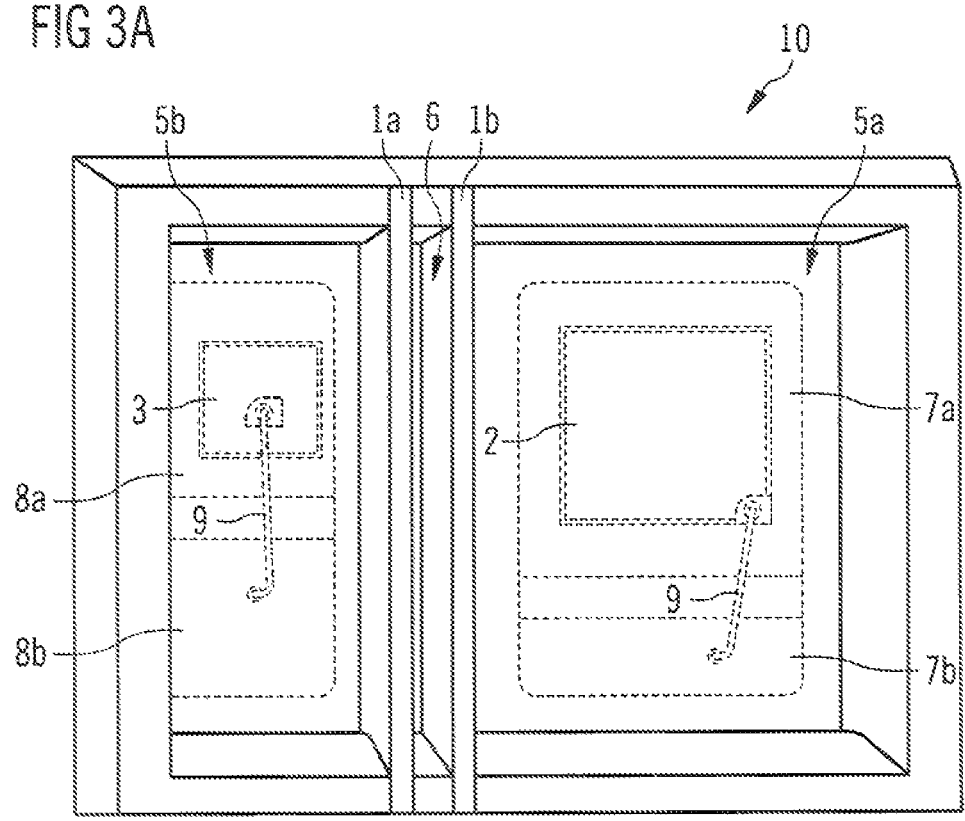
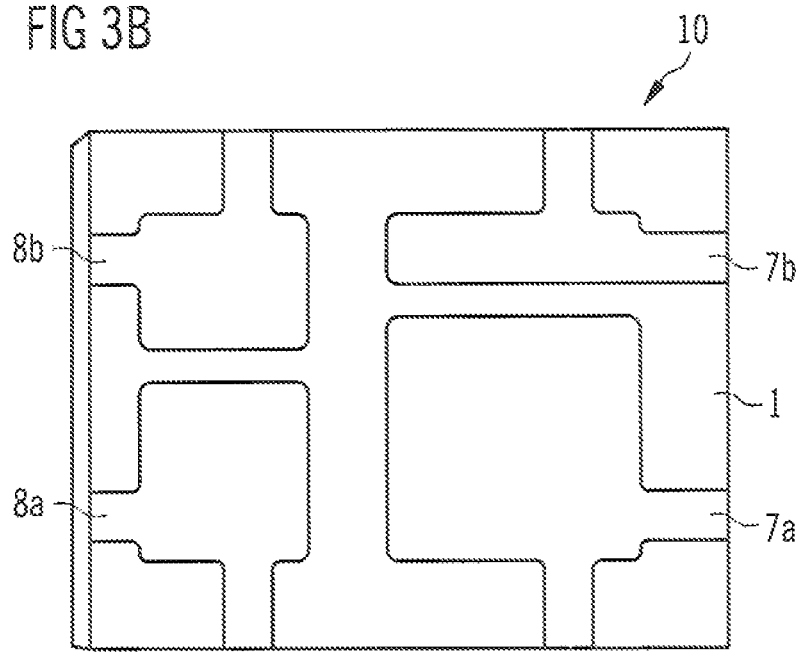

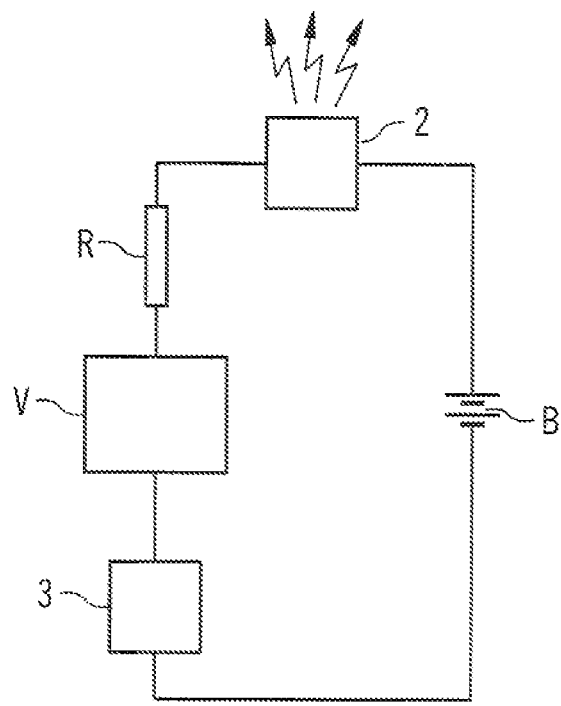
FIG 4    (Prior Art)

OPTOELECTRONIC SEMICONDUCTOR COMPONENT, METHOD FOR PRODUCING SAME AND USE OF SUCH A COMPONENT

TECHNICAL FIELD

This disclosure relates to an optoelectronic component comprising a housing, a radiation-emitting semiconductor chip and a radiation-detecting semiconductor chip, a method of producing such a component and a use of such a component.

BACKGROUND

It is known to design components comprising a radiation-emitting semiconductor chip and a radiation-detecting semiconductor chip. However, these devices conventionally comprise semiconductor chips arranged in separate housings and separately from one another on a printed circuit board, for example. As a result, however, such devices usually disadvantageously require a large space requirement and large component parts. That in turn is usually reflected disadvantageously in the production costs and component costs.

It could therefore be helpful to provide a compact component and at the same time reacts flexibly to environmental influences. Furthermore, it could be helpful to provide a method of producing such a component which is cost-effective, and to provide a flexible and at the same time reliable use of such components.

SUMMARY

We provide an optoelectronic semiconductor component including a housing, a radiation-emitting semiconductor chip and a radiation-detecting semiconductor chip, wherein a first cavity and a second cavity are formed in the housing, the radiation-emitting semiconductor chip has an active layer that generates radiation and is arranged in the first cavity, which is potted with a first potting component, the radiation-detecting semiconductor chip has an active layer that detects radiation and is arranged in the second cavity, which is potted with a second potting compound, and absorber particles are embedded in the second potting compound, the absorber particles being at least partly absorbing the radiation emitted by the radiation-emitting semiconductor chip.

We also provide an intelligent light source including the semiconductor component which instigates operation of the radiation-emitting semiconductor chip depending on a detected portion of external radiation, wherein the radiation-emitting semiconductor chip is an LED that emits visible radiation and the radiation-detecting semiconductor chip is a photodetector that detects IR radiation.

We further provide a method of producing an optoelectronic semiconductor component including a housing, a radiation-emitting semiconductor chip and a radiation-detecting semiconductor chip, including providing the housing having a first cavity and a second cavity, arranging the radiation-emitting semiconductor chip in the first cavity and potting the first cavity with a first potting compound, arranging the radiation-detecting semiconductor chip in the second cavity and potting the second cavity with a second potting compound, wherein 1) absorber particles are embedded in the second potting compound, the absorber particles at least partly absorbing the radiation emitted by the radiation-emitting semiconductor chip, and 2) the radiation-emitting semiconductor chip is an LED that emits visible radiation and the radiation-detecting semiconductor chip is a photodetector that detects IR radiation.

BRIEF DESCRIPTION OF THE DRAWINGS

FIG. 1A shows a schematic cross section of an example of our component.

FIG. 1B shows a schematic oblique view of the example in FIG. 1A.

FIG. 2 shows a circuit diagram concerning the example in FIG. 1A.

FIG. 3A shows a plan view of the example in FIG. 1A.

FIG. 3B shows a view of the underside of the example in FIG. 1A.

FIG. 4 shows a conventional circuit diagram.

DETAILED DESCRIPTION

The optoelectronic semiconductor component may comprise a housing, a radiation-emitting semiconductor chip and a radiation-detecting semiconductor chip. A first cavity and a second cavity may be formed in the housing. The radiation-emitting semiconductor chip may have an active layer that generates radiation and is arranged in the first cavity, which may be potted with a first potting compound. The radiation-detecting semiconductor chip may have an active layer that detects radiation and is arranged in the second cavity, which may be potted with a second potting compound. Absorber particles may be embedded in the second potting compound, the absorber particles being suitable to at least partly absorb the radiation emitted by the radiation-emitting semiconductor chip.

The radiation-emitting semiconductor chip and the radiation-detecting semiconductor chip are thus integrated in a common housing. That makes possible, in particular, a compact semiconductor component distinguished by a small size, as a result of which the material costs are advantageously reduced. On account of the absorber particles in the second potting compound, detection of the radiation emitted by the radiation-emitting semiconductor chip by the radiation-detecting semiconductor chip can advantageously be prevented. The detection only of external radiation by the radiation-detecting semiconductor chip is thus advantageously made possible.

Consequently, the radiation-emitting semiconductor chip and the radiation-detecting semiconductor chip hardly influence or do not influence one another during operation. It is thus advantageously possible to realize a component which reacts flexibly to sunlight, for example, on account of the radiation-detecting semiconductor chip, wherein at the same time it is possible to prevent the emitted radiation of the radiation-emitting semiconductor chip from influencing the radiation-detecting semiconductor chip.

The radiation-emitting semiconductor chip has a radiation exit side for the radiation generated in the semiconductor chip. A large portion of the radiation generated in the chip is preferably coupled out from the radiation exit side. On the opposite side relative to the radiation exit side, the radiation-emitting semiconductor chip has a fixing side, by which the radiation-emitting semiconductor chip is arranged in the first cavity of the housing.

The radiation-detecting semiconductor chip has a corresponding radiation entrance side for the radiation to be detected in the semiconductor chip and, opposite the radiation entrance side, a fixing side, by which the radiation-detecting semiconductor chip is arranged in the second cavity of the housing.

The active layers of the semiconductor chips in each case preferably contain a pn junction, a double heterostructure, a single quantum well (SQW) structure or a multi quantum well (MQW) structure.

The semiconductor chips in each case have a semiconductor layer sequence, for example, which in each case contain the active layer. The semiconductor layer sequences in each case contain at least one III/V semiconductor material.

The radiation-detecting semiconductor chip may be provided to detect radiation in a wavelength range that differs from the emissive wavelength range of the radiation-emitting semiconductor chip.

Preferably, the radiation-emitting semiconductor chip generates radiation having a wavelength of 400 nm to 800 nm or 420 nm to 650 nm. Alternatively or additionally, the radiation-detecting semiconductor chip detects IR radiation having a wavelength of 750 nm to 1500 nm or 800 nm to 1050 nm or 840 nm to 920 nm. In particular, the semiconductor chips emit and/or detect radiation exclusively in the wavelength ranges specified.

The radiation-detecting semiconductor chip is therefore sensitive to radiation outside the wavelength range of the radiation emitted by the radiation-emitting semiconductor chip. This makes it possible for the radiation-detecting semiconductor chip to detect only external radiation which, in particular, is independent of the radiation emitted by the radiation-emitting semiconductor chip.

The radiation-emitting semiconductor chip may be energized via the radiation-detecting semiconductor chip. The detecting semiconductor chip is thus provided as a switch that energizes the radiation-emitting semiconductor chip. The operation of the radiation-emitting semiconductor chip thus takes place, or does not take place, depending on the radiation-detecting semiconductor chip.

By way of example, in the case of incident radiation, the radiation-detecting semiconductor chip in this case switches off the radiation-emitting semiconductor chip. In contrast, if the radiation-detecting semiconductor chip detects no radiation or only a small portion of radiation, then it switches on the radiation-emitting semiconductor chip.

An optical barrier on the basis of the cavity walls may be formed between the radiation-emitting semiconductor chip and the radiation-detecting semiconductor chip. The radiation emitted by the radiation-emitting semiconductor chip thus cannot be directly detected by the radiation-detecting semiconductor chip. If a portion of the radiation emitted by the semiconductor chip nevertheless passes into the cavity of the radiation-detecting semiconductor chip, then this portion is absorbed by the absorber particles in the potting material such that even this portion does not reach the radiation-detecting semiconductor chip. A situation where the radiation emitted by the radiation-emitting semiconductor chip influences the radiation-detecting semiconductor chip can thus be precluded such that the radiation-detecting semiconductor chip can react reliably to incidence of external radiation.

So-called "crosstalk" can be avoided on account of the cavity walls. It is thus possible to prevent radiation generated by the radiation-emitting semiconductor chip from passing directly to the radiation-detecting semiconductor chip. Preferably, it is also the case that no radiation generated by the radiation-emitting semiconductor chip indirectly impinges on the radiation-detecting semiconductor chip, or only a portion of at most $10^{-3}$ or of at most $10^{-4}$ of such radiation impinges thereon.

The first and second cavities of the housing may be mechanically separated from one another by an integrated separating slot. The separating slot may be formed, in particular, between the cavity walls of the first cavity and of the second cavity.

The first potting compound may be a silicone potting compound and the second potting compound may be an epoxy resin potting compound. The potting compounds above the semiconductor chips can be adapted in accordance with desired requirements. Thus, by way of example, a potting material which reacts sensitively to the radiation to be detected can serve as potting material for the first cavity. Thus, the respective potting material can be correspondingly optimally adapted with regard to the material costs and desired requirements.

The radiation-emitting semiconductor chip may be an LED that emits visible radiation and the radiation-detecting semiconductor chip may be a photodetector that detects IR radiation.

In this case, the radiation-emitting semiconductor chip is suitable for lighting. In this case, the photodetector detects the external sunlight, in particular the incident IR radiation contained therein. In the case of incident IR radiation, the detector in this case switches off the LED. In contrast, if the detector does not detect IR radiation, then it switches on the LED such that a component which reacts flexibly to sunlight can be realized.

In each case, two printed circuit boards encapsulated with housing material by molding may be integrated in the housing for the semiconductor chips. The printed circuit boards are provided, in particular, to make electrical contact with the semiconductor chips. In particular, the printed circuit boards in each case form at least in regions base surfaces of the first and second cavities, on which the semiconductor chips are in each case fixed directly.

The housing may contain a black colored epoxide. This advantageously furthermore makes it possible to prevent radiation emitted by the radiation-emitting semiconductor chip from influencing the radiation-detecting semiconductor chip.

The housing may be coated with nickel, palladium and/or gold at least in regions. On account of such a coating, the portion of light emitted by the radiation-emitting semiconductor chips in the direction of the housing or of the cavity walls can be reflected in the direction of the radiation exit side.

The housing may be a QFN housing (quad flat no leads housing). Such QFN housings are known and will therefore not be explained in any greater detail.

The semiconductor component may be used as an intelligent light source, which instigates operation of the radiation-emitting semiconductor chip depending on the detected portion of external radiation. If the detected portion of external radiation falls below a certain limit value, then the radiation-detecting semiconductor chip switches on the energization of the radiation-emitting semiconductor chip such that the latter emits visible radiation, that is to say serves as a light source. If the detected portion of external radiation lies above the limit value, then the radiation-detecting semiconductor chip switches off the energization of the radiation-emitting semiconductor chip, such that the radiation-emitting semiconductor chip does not emit radiation, as a result of which the light source is no longer in operation.

The external radiation is, for example, solar radiation, preferably infrared radiation.

Our method of producing an optoelectronic semiconductor component comprising a housing, a radiation-emitting semiconductor chip and a radiation-detecting semiconductor chip comprises the following method steps:

provinding the housing having a first cavity and a second cavity, arranging the radiation-emitting semiconductor chip in the first cavity and potting the first cavity with a first potting compound, arranging the radiation-detecting semiconductor chip in the second cavity and potting the second cavity with a second potting compound, wherein absorber particles are embedded in the second potting compound, the absorber particles at least partly absorbing the radiation emitted by the radiation-emitting semiconductor chip.

The features mentioned in conjunction with the optoelectronic component or the use thereof also apply to the method and vice versa.

On account of the arrangement of the semiconductor chips in a common housing, it is possible to realize a cost-effective production method which is distinguished, in particular, by a small space requirement.

A plurality of semiconductor components may be produced in a common method, the semiconductor components subsequently being singulated with a sawing process. This makes it possible to produce such semiconductor components in a mass production process.

Further advantages and advantageous developments will become apparent from the following examples described in conjunction with FIGS. 1 to 4.

In the figures, identical or identically acting constituent parts may in each case be provided with the same reference signs. The illustrated constituent parts and their size relationships among one another should not be regarded as true to scale, in principle. Rather, individual constituent parts such as, for example, layers, structures, component parts and regions may be illustrated with exaggerated thickness or size dimensions to enable better illustration and/or afford a better understanding.

FIG. 4 illustrates an example of a conventional circuit diagram of a component. Such a component comprises a radiation-emitting semiconductor chip 2 and a radiation-detecting semiconductor chip 3. These semiconductor chips electrically conductively connect to one another. However, the respective semiconductor chips are arranged in separate units or housings. In this case, the housings are arranged separately and at a distance from one another, for example, on a printed circuit board. On account of the separate arrangement, however, the size of the printed circuit board is not compact.

A resistor R, a voltage regulator V and a six-volt battery B are arranged between the radiation-emitting semiconductor chip 2 and the radiation-detecting semiconductor chip 3.

FIG. 1A illustrates a cross section of a component 10. The component 10 comprises a housing 1, a radiation-emitting semiconductor chip 2 and a radiation-detecting semiconductor chip 3.

The housing 1 has a first cavity 4a and a second cavity 4b. Cavity walls 1a, 1b are arranged between the first cavity 4a and the second cavity 4b. The first and second cavities 4a, 4b are formed, for example, as perforations through the housing 1. At a housing underside, printed circuit boards 7a, 8a are respectively arranged in the base regions of the first and second cavities 4a, 4b such that perforations of the first and second cavities 4a, 4b are closed at the underside of the housing 1. In this case, the housing material of the housing 1 partly projects onto a mounting side of the printed circuit boards 7a, 8a such that the printed circuit boards 7a, 8a mechanically fixedly connect to the housing 1. By way of example, the housing 1 with printed circuit boards 7a, 8a arranged therein is a prefabricated housing, also known by the term "premolded housing".

The radiation-emitting semiconductor chip 2 is arranged in the first cavity 4a, in particular on the mounting side of the first printed circuit board 7a. The radiation-emitting semiconductor chip 2 is, for example, an LED, preferably a thin-film LED. The radiation-emitting semiconductor chip 2 mechanically and electrically conductively connects by an underside on the mounting side of the first printed circuit board 7a. The semiconductor chip 2 electrically conductively connects to a second printed circuit board from its top side by a bonding wire 9, thereby enabling electrically conductive contact to be made with the radiation-emitting semiconductor chip 2.

The same correspondingly applies to the radiation-detecting semiconductor chip 3, which is a photodetector, for example. This semiconductor chip is arranged in the second cavity 4b and electrically conductively and mechanically connects to a third printed circuit board 8a. The second contact-connection of the radiation-detecting semiconductor chip 3 is effected by a bonding wire 9 to a fourth printed circuit board.

The first, second, third and fourth printed circuit boards are illustrated and explained in greater detail, for example, in conjunction with the examples in FIGS. 1B, 3A and 3B.

The heights of the first and second cavities 4a, 4b are preferably greater than the heights of the semiconductor chips 2, 3. The housing, in particular the cavity walls, thus projects completely beyond the semiconductor chips 2, 3. On account of the cavity walls 1a, 1b, optical crosstalk of the semiconductor chips 2, 3 with respect to one another can thus be prevented. In particular, radiation emitted by the radiation-emitting semiconductor chip 2 cannot be directly detected by the radiation-detecting semiconductor chip 3.

The radiation-emitting semiconductor chip 2 and the radiation-detecting semiconductor chip 3 each have an active layer. The active layer of the radiation-emitting semiconductor chip 2 generates radiation. The active layer of the radiation-detecting semiconductor chip 3 detects radiation. The radiation-detecting semiconductor chip 3 is provided, in particular, to detect radiation in a wavelength range that differs from the emitting wavelength range the radiation-emitting semiconductor chip 2. This makes it possible that the radiation-detecting semiconductor chip does not react sensitively to the radiation emitted by the radiation-emitting semiconductor chip.

The radiation-emitting semiconductor chip 2 is preferably an LED that emits visible radiation. The radiation-detecting semiconductor chip 3 is preferably a photodetector that detects infrared radiation.

An optical barrier by the cavity walls 1a, 1b is formed between the radiation-emitting semiconductor chip 2 and the radiation-detecting semiconductor chip 3. Thus, the radiation emitted by the LED cannot be directly detected by the photodetector. A separating slot is formed between the cavity walls 1a, 1b of the first cavity 4a and of the second cavity 4b, the separating slot mechanically separating the first and second cavities 4a, 4b of the housing 1 from one another. The housing 1 is integral despite the separating slot 6.

In the first cavity 4a, the radiation-emitting semiconductor chip 2 is potted with a silicone potting compound. The radiation-detecting semiconductor chip 3 is potted with an epoxy resin potting compound in the second cavity 4b, wherein the epoxy resin potting compound 5b comprises absorber particles suitable that at least partly absorb radiation emitted by the radiation-emitting semiconductor chip 2. If the radiation emitted by the radiation-emitting semiconductor chip 2 passes into the second cavity 4b, then this portion of the radiation is absorbed by the absorber particles of the epoxy resin porting compound 5b such that this portion does not reach the radiation-detecting semiconductor chip 3. It is thus possible to prevent the radiation detector 3 from being influenced by the radiation emitted by the LED 2.

In this case, the silicone potting compound 5a and the epoxy resin potting compound 5b completely fill the first cavity 4a and the second cavity 4b such that the component 10 has a preferably substantially planar surface.

The housing 1 preferably contains a black colored epoxide and is coated with nickel, palladium and/or gold at least in regions. By way of example, the housing is a QFN housing.

The radiation-emitting semiconductor chip 2 is energized via the radiation-detecting semiconductor chip. The detecting, semiconductor chip is thus a switch that energizes the emitting semiconducting chip and thus operates the emitting semiconductor chip. It is thus possible to produce an intelligent light source which instigates operation of the radiation-emitting semiconductor chip 2 depending on detected portion of external radiation. By way of example, solar radiation is regarded as external radiation. Consequently, if the radiation-detecting semiconductor chip 3 detects radiation in the infrared wavelength range above a certain limit value, the radiation detector 3 switches off energization of the radiation-emitting semiconductor chip 2 such that the latter does not emit radiation. That would be the case, for example, if a certain portion of beams of sunlight are present in the vicinity of the component 10 such that lighting by the component 10 is not necessary.

In contrast, if the radiation detector 3 detects a portion of external radiation below a specific limit value, then the radiation detector 3 switches on the energization of the radiation-emitting semiconductor chip 2 such that the latter emits radiation. That is the case, for example, if the portion of external beams of sunlight decreases, for example, at night such that generation of light by the component is necessary.

On account of the common arrangement of the semiconductor chips 2, 3, it is possible to realize a compact component 10 which can be operated reliably and is expedient in terms of production and component costs.

Such a component 10 can be produced in a mass production method, for example, by virtue of a plurality of such components being produced jointly, which components are subsequently singulated by sawing, for example.

FIG. 1B illustrates an oblique view of a component 10, for example, in accordance with the example in FIG. 1A. Arranged at the base surface of the first cavity 4a is the first printed circuit board 7a and the second printed circuit board 7b, by which electrical contact can be made with the radiation-emitting semiconductor chip 2. The same correspondingly applies to the radiation-detecting semiconductor chip 3, which is arranged and electrically conductively connected on a third printed circuit board 8a and the second contact-connection of which is effected by a fourth printed circuit board 8b. The separating slot 6 between the cavity walls 1a, 1b can be free of potting compound. Alternatively, potting compound, for example, of the first cavity 4a or of the second cavity 4b can additionally be introduced in the separating slot 6. In this case, the radiation exit side of the radiation emitted by the radiation-emitting semiconductor chip 2 from the component 10 is implemented from the opposite side relative to the underside.

For the rest, the example of FIG. 1B substantially corresponds to the example in FIG. 1A.

FIG. 2 illustrates a circuit diagram, for example, of a component 10 in accordance with the example in FIG. 1A. As illustrated in the circuit diagram, the semiconductor chips 2, 3 are arranged in a common housing and electrically conductively connect to one another. An anode A and cathode C respectively connect in each case to the input and output of the semiconductor chips 2, 3. The semiconductor chips 2, 3 interconnect with one another by various electrical components.

A plan view of, for example, a component 10 in accordance with the example in FIG. 1A is illustrated in the example in FIG. 3A. The printed circuit boards 7a, 7b, 8a, 8b make electrical contact with the semiconductor chips 2, 3 and are visible in a plan view of the first cavity and the second cavity. The individual printed circuit boards 7a, 7b, 8a, 8b are arranged in a manner electrically insulated from one another. In particular, electrically insulating housing material is arranged between the individual printed circuit boards.

The cavities are completely enclosed by the cavity walls. The separating slot 6 is arranged between the two cavities, the separating slot being free of potting material in this example.

For the rest, the example in FIG. 3A corresponds to the example in FIG. 1A.

FIG. 38 illustrates a bottom view of a component 10 in accordance with the example in FIG. 3A. The individual printed circuit boards 7a, 7b, 8a, 8b make electrical contact with the semiconductor chips 2, 3 and are visible from the underside. The printed circuit boards are arranged in a manner electrically insulated from one another. In particular, the individual printed circuit boards are arranged with a spacing with respect to one another, the spacing being filled with housing material 1. Electrical contact can be made with the component 10 externally from its underside, wherein, for example, the underside is mounted on an external printed circuit board and electrically conductively connects thereto. The component 10 is, in particular, a surface-mountable component.

For the rest, the example of FIG. 3B corresponds to the example of FIG. 3A.

Our components and methods are not restricted to the examples by the description on the basis of the examples. Rather, this disclosure encompasses any novel feature and also any combination of features, which in particular includes any combination of features in the appended claims, even if these features themselves or this combination itself are/is not explicitly specified in the claims or examples.

The invention claimed is:

1. An optoelectronic semiconductor component comprising a housing, a radiation-emitting semiconductor chip and a radiation-detecting semiconductor chip, wherein:
   a first cavity and a second cavity are formed in the housing,
   the radiation-emitting semiconductor chip has an active layer that generates radiation and is arranged in the first cavity, which is potted with a first potting compound,
   the radiation-detecting semiconductor chip has an active layer that detects radiation and is arranged in the second cavity, which is potted with a second potting compound, and
   absorber particles are embedded in the second potting compound, the absorber particles at least partly absorbing the radiation emitted by the radiation-emitting semiconductor chip, wherein
   the radiation-detecting semiconductor chip:
   1) detects only radiation in a wavelength range that differs from the wavelength range of the emitted radiation of the radiation-emitting semiconductor chip,
   2) generates visible radiation having a wavelength of 400 nm to 700 nm during operation,
   3) detects IR radiation having a wavelength of 800 nm to 1500 nm, and 4) detects external sunlight and switches off the radiation-emitting semiconductor chip if sunlight is detected and switches on the radiation-emitting semiconductor chip if no sunlight is detected.

2. The semiconductor component according to claim 1, wherein the radiation-emitting semiconductor chip is energized via the radiation-detecting semiconductor chip.

3. The semiconductor component according to claim 1, wherein an optical barrier on the basis of cavity walls is formed between the radiation-emitting semiconductor chip and the radiation-detecting semiconductor chip.

4. The semiconductor component according to claim 1, wherein the first and second cavities of the housing are mechanically separated from one another by an integrated separating slot.

5. The semiconductor component according to claim 1, wherein the first potting compound is a silicone potting compound and the second potting compound is an epoxy resin potting compound.

6. The semiconductor component according to claim 1, wherein the radiation-emitting semiconductor chip is an LED that emits visible radiation and the radiation-detecting semiconductor chip is a photodetector that detects IR radiation.

7. The semiconductor component according to claim 1, wherein two printed circuit boards encapsulated with housing material by molding are integrated in the housing for the radiation-emitting semiconductor chip and the radiation-detecting semiconductor chip.

8. The semiconductor component according to claim 1, wherein
   the housing contains a black colored epoxide, and
   wherein the housing is coated with nickel, palladium and/or gold at least in regions.

9. The semiconductor component according to claim 1, wherein the housing is a QFN housing.

10. An intelligent light source comprising the semiconductor component according to claim 1, which instigates operation of the radiation-emitting semiconductor chip depending on a detected portion of external radiation, wherein the radiation-emitting semiconductor chip is an LED that emits visible radiation and the radiation-detecting semiconductor chip is a photodetector that detects IR radiation.

11. The light source according to claim 10, wherein the external radiation is solar radiation.

12. A method of producing the optoelectronic semiconductor component according to claim 1, comprising a housing, a radiation-emitting semiconductor chip and a radiation-detecting semiconductor chip, comprising:
   providing the housing having a first cavity and a second cavity,
   arranging the radiation-emitting semiconductor chip in the first cavity and potting the first cavity with a first potting compound,
   arranging the radiation-detecting semiconductor chip in the second cavity and potting the second cavity with a second potting compound, wherein
   1) absorber particles are embedded in the second potting compound, the absorber particles at least partly absorbing the radiation emitted by the radiation-emitting semiconductor chip,
   2) the radiation-emitting semiconductor chip is an LED that emits visible radiation and the radiation-detecting semiconductor chip is a photodetector that detects IR radiation, and
   3) a plurality of semiconductor components are produced in a common method, said semiconductor components subsequently being singulated by sawing.

\* \* \* \* \*